United States Patent [19]
Takahashi

[11] Patent Number: 5,946,263
[45] Date of Patent: Aug. 31, 1999

[54] MEMORY DEVICE HAVING SEPARATE DRIVER SECTIONS

[75] Inventor: Hiroyuki Takahashi, Tokyo, Japan

[73] Assignee: NEC Corporation, Tokyo, Japan

[21] Appl. No.: 09/060,295

[22] Filed: Apr. 15, 1998

[30] Foreign Application Priority Data

Apr. 15, 1997 [JP] Japan .................................. 9-097074

[51] Int. Cl.[6] .................................................. G11C 8/00
[52] U.S. Cl. ............................... 365/230.06; 365/230.04
[58] Field of Search .......................... 365/230.04, 230.03, 365/230.06

[56] References Cited

U.S. PATENT DOCUMENTS 5,818,776  10/1998  Shibutani et al. .................. 365/230.05

FOREIGN PATENT DOCUMENTS 4-335296  11/1992  Japan .
7-21780   1/1995   Japan .

*Primary Examiner*—David Nelms
*Assistant Examiner*—M. Tran
*Attorney, Agent, or Firm*—Foley & Lardner

[57] ABSTRACT

A SRAM has a single digit lines between adjacent rows, a first pair of data lines, a second pair of data lines, a first digit line drive section for selectively connecting the pairs of digit lines to the first data lines, and a second digit line drive section, disposed opposite to the first digit line drive section, for selectively connecting the pairs of digit lines to the second data lines. The separate drive sections reduce the numbers of transistor elements and interconnects disposed for each row of the memory cells, thereby reducing the space requested between memory cells. Word line drive is also divided into two sections disposed opposite to each other.

12 Claims, 8 Drawing Sheets

MEMORY DEVICE HAVING SEPARATE DRIVER SECTIONS

BACKGROUND OF THE INVENTION

(a) Field of the Invention

The present invention relates to a semiconductor memory device and, more particularly, to a structure suited for a static random access memory (DRAM) device.

(b) Description of the Related Art

In a SRAM device, write and read operations for memory cells are generally performed through a pair of digit lines (bit lines), which requests that two metallic digit lines be disposed between adjacent two columns of the memory cells. With the advance of a finer pattern in the memory array, the space between adjacent two metallic lines has been reduced and the parasitic capacitance of the gate electrode has increased. This means that the speed of the potential change of the digit lines does not increase to the extent that the pattern dimensions of the memory array decrease.

To increase the operational speed of the SRAM device, Patent Publication JP-A-4-335296 proposes a technique wherein each of the pair of digit lines is shared by adjacent two columns of the memory cells. FIG. 1 shows the proposed SRAM device, wherein only one of the rows and four of the columns in n×m matrix are shown in the drawing for brevity.

Each memory cell 11, 12, . . . 1 m in has a flip-flop for storing data on a pair of internal memory nodes and a pair of transfer transistors controlled by a corresponding one of word lines W1 and W2 for connecting the memory nodes in a selected memory cell to the pair of digit lines disposed adjacent thereto. Specifically, memory cells 11 and 13 each disposed in an odd-numbered column is connected to digit lines B1 and B2 and digit lines B3 and B4, respectively, and word line W1. Memory cells 12 and 14 each disposed in an even-numbered column is connected to digit lines B2 and B3 and digit lines B4 and B5, respectively, and word line W2.

Signals for activating the word lines W1 and W2 are generated by respective word drivers WD1 and WD2 implemented by AND gates receiving at inputs thereof a signal (word decoded signal) X1 from a row decoder not shown and bank selection signals BS1 and BS2, which specify an odd-numbered bank and an even-numbered bank, respectively. The data on the selected pair of digit lines B1–Bm+1 is transferred to data lines D and DB through a corresponding pair of column switches (implemented by transfer gates) each including an nMOSFET (such as M1a, M1b) and a pMOSFET (such as M2a, M2b) having gates for receiving a pair of digit line selection signals Y1 and Y1B, Y2 and Y2B, . . . . The digit line selection signals are generated by an AND of a signal from a column decoder and bank selection signal BS1 or BS2.

In operation, when a memory cell in an odd-numbered column, memory cell 11 for example, is to be selected, word line W1 and digit line selection signals Y1 and Y1B are activated by word, digit and bank selection signals to couple the digit lines B1 and B2 to data lines D and DB, respectively. As a result, the data read out from memory cell 11 in a read operation generates a potential difference between the digit lines B1 and B2 and is transferred to the data lines D and DB, whereas data supplied from the data lines D and DB in a write operation is transferred to and stored in memory cell 11 through the digit lines B1 and B2.

When a memory cell in an even-numbered row, memory cell 12 for example, is to be selected subsequently, word line W2 and digit line selection signals Y2 and Y2B are activated to couple memory cell 11 to the digit lines B2 and B3 and couple the digit lines B2 and B3 to the data lines D and DB after the bank selection signal is changed. In this exemplified operation, digit line B2 is common to memory cell 11 and memory cell 12, and a similar situation results in the memory cells in each adjacent two of the columns.

The configuration of a single digit line for each adjacent two of the columns as described above has the advantages of a larger space between digit lines, reduction of parasitic capacitance between the digit lines, improved yield (ratio of the number of non-defective products to the number of total products) due to a lower possibility of a short-circuit failure and space reduction of memory cells due to a lower limit for the line space over the conventional SRAM device.

The proposed SRAM device, however, has problems when implemented as a practical product. Specifically, the signal lines transmitting the digit line selection signals Y1 and Y1B and the pair of transfer gates such as M1a, M1b, M2a and M2b disposed for each of the columns substantially define the pitch of the columns in the product, which fact prevents the reduction of the space between the memory cells. In addition, a pair of word drives disposed for each of the rows in the peripheral circuit of the SRAM device substantially define the pitch of the rows of the memory cell. Further, the region for receiving high-density interconnects for the transfer gates tends to reduce the yield due to the requested finer pattern for the high-density interconnects. In short, it is generally difficult to obtain the advantages from the reduction of the digit lines in number without further improving the layout of the peripheral circuit of the SRAM device.

Another configuration which improves the line density for the digit line selection circuit is proposed in Patent Publication JP-A-7-21780 (second publication). FIG. 2 shows a block diagram of the proposed SRAM, wherein the number of transfer gates is reduced down to substantially a half the number of the transfer gates in the aforementioned (first) publication. A digit line B1, B2, B3 . . . is associated only with a pair of transistors such as nMOSFET 31a and pMOSFET 32a in the second publication. In FIGS. 1 and 2, similar constituent elements are designated by the same or similar reference numerals for the sake of understanding.

In FIG. 2, when memory cell 11 is to be selected, signals Y1B and Y2B are low and high, respectively, resulting in ON-state of nMOSFETs M31a, M31b and M31c and pMOSFETs M32a, M32b and M32c. As a result, three digit lines B1, B2 and B3 are coupled to data line D or DB, which may involve erroneous read-out of the data from memory cell 13 or erroneous storing of the data on the data line D and DB in memory cell 13 due to the active state of word line W1 although such a erroneous read-out or storing from memory cell 12 is prevented by an inactive state of word line W2.

SUMMARY OF THE INVENTION

It is an object of the present invention to provide a high-operational speed memory device having reduced dimensions and suited for a SRAM device by improving the circuit structure of the peripheral circuit for a memory array having a single digit line.

The present invention provides a memory device comprising a memory array including a plurality of memory cells arranged in a matrix along a column direction and a row direction, a pair of digit lines extending along the column direction for each column of the memory cells so that each of the digit lines disposed between adjacent two columns is shared by the two columns, a pair of word lines extending in the row direction for each row of the memory cells, one of the pair of word lines being connected to memory cells in odd-numbered columns and the other of the pair of word lines being connected to memory cells in even-numbered columns, a word driver controlled by a bank selection signal for selectively activating either one of the pair of word lines, first and second pairs of data lines disposed in vicinities of one and the other sides, respectively, of the memory array, a first digit driver sections for selectively connecting the pairs of digit lines to the pair of first data lines, a second digit driver sections for selectively connecting the pairs of digit lines to the pair of second data lines, the bank selection signal activating either one of the first and second digit driver sections.

In accordance with the present invention, each of the digit driver sections having small dimensions can be disposed in the space between adjacent column or the memory cells without raising the space, and accordingly. As a result, the present invention can provide a high-density and a high-speed memory device.

The above and other objects, features and advantages of the present invention will be more apparent from the following description, referring to the accompanying drawings.

PREFERRED EMBODIMENTS OF THE INVENTION

Figure 1:
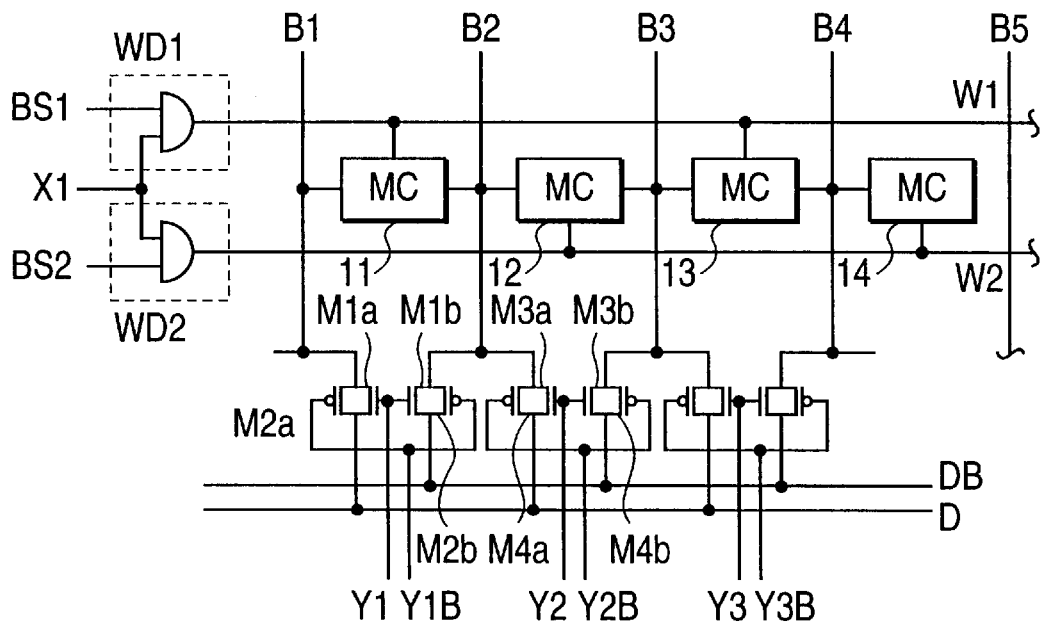
FIG. 1 is a schematic diagram of a memory device proposed by a publication.
Figure 2:
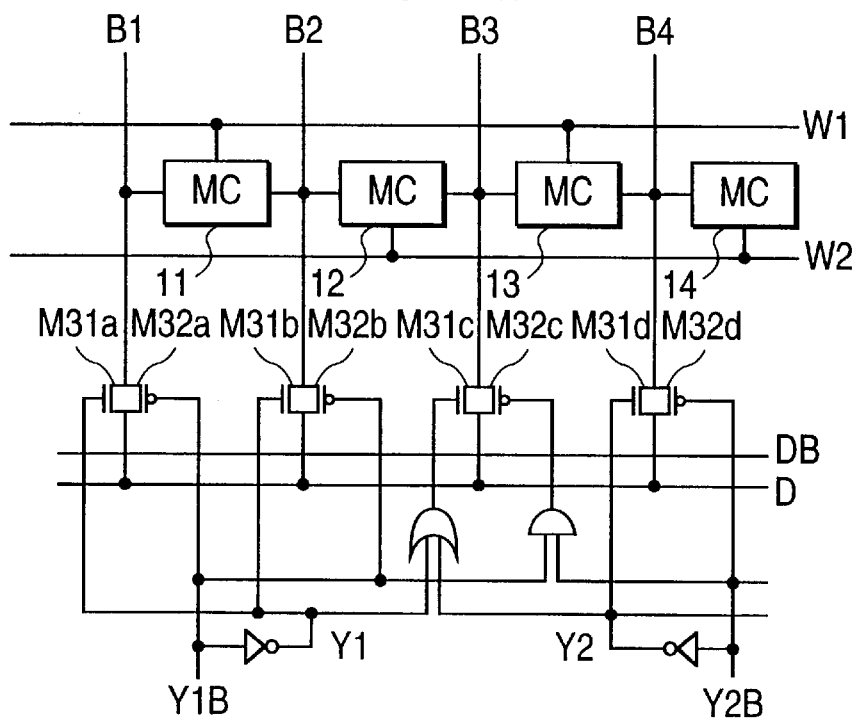
FIG. 2 is a schematic diagram of a memory device proposed by another publication.

Now, the present invention is more specifically described with reference to accompanying drawings, wherein similar constituent elements are designated by the same or similar reference numerals.

Figure 3:
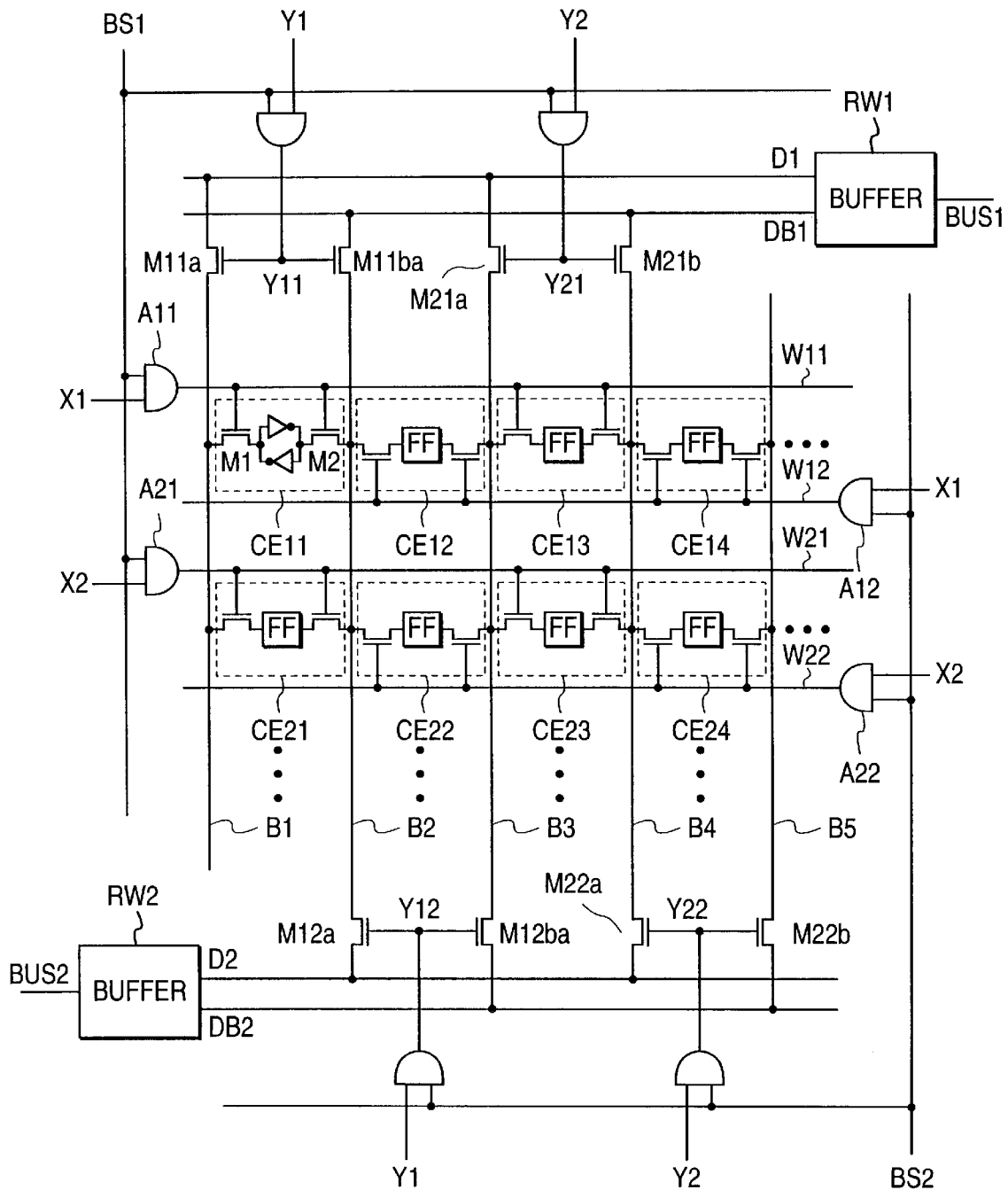
FIG. 3 is a schematic diagram of a memory device according to a first embodiment of the present invention.

Referring to FIG. 3, a memory device according to a first embodiment of the present invention and implemented as a SRAM device comprises a plurality of memory cells CEij (CE11-CE1$m$, CE21-CE2$m$, . . . , CEn1-CEnm) disposed in a n×m matrix along a row direction and a column direction. J-th column of the memory cells is associated with a pair of digit lines Bj and Bj+1, each of which is shared by adjacent two columns except for the first and the last digit lines B1 and Bm+1. i-th row of the memory cells is associated with a pair of dedicated word lines Wi1 and Wi2.

The pair of word lines Wi1 and Wi2 disposed for i-th row of memory cells are connected to the gates of the transfer transistors in the memory cells in odd-numbered columns and the gates of the transfer transistors in the memory cells in even-numbered columns, respectively. The word line Wi1 for the odd-numbered columns is activated by a word selection signal supplied from a word driver disposed at the left side and implemented as an AND gate Ai1 receiving a word decoded signal Xi and bank selection signal BS1, whereas the word line Wi2 for the even-numbered coluions is activated by a word selection signal supplied from an AND gate Ai2 disposed at the right side and receiving the word decoded signal Xi and bank selection signal BS2.

The selection of a pair of digit lines $B_j$, and $B_{j+1}$ for accessing an odd-numbered j-th column (j=2k−1) of the memory cells is performed by activating switching transistors $M_{k1a}$ and $M_{k1b}$ having gates receiving an AND $Y_{k1}$ of bank selection signal BS1 and digit decoded signal $Y_k$. The memory cell selected by a word decoded signal $Y_k$ is connected to data line D1 and DB1 through the switching transistors $M_{k1a}$ and $M_{k1b}$, and connected to an input/output data bus BUS1 through a read/write buffer RW1.

The selection of a pair of digit lines $B_j$ and $B_{j+1}$ for accessing an even-numbered (j-th) column (j=2k) of the memory cells is performed by activating switching transistors $M_{k2a}$, and $M_{k2b}$ having gates receiving an AND $Y_{k1}$ of bank selection signal BS2 and digit decoded signal $Y_k$. The memory cell selected by a word decoded signal $Y_k$ is connected to data line D2 and DB2 through switching transistors $M_{k2a}$ and $M_{k2b}$, and connected to input/output data bus BUS2 through a read/write buffer RW2.

In this configuration, each of the digit lines B2-Bm is shared by an odd-numbered row of the memory cells and an adjacent even-numbered row of the memory cells, whereas digit switching transistors $M_{k1a}$, $M_{k1b}$ etc., AND gates for activating the digit switching transistors, data lines and read/write buffers are separately provided both for the odd-numbered row and the even-numbered row.

In operation, when a memory cell, for example, memory cell CE11 is to be selected, word line W11 is activated by AND gate A11 receiving a high level of the bank selection signal BS1 and a high level of the word decoded signal X1, thereby activating the transfer transistors of the first row of the memory cells. If a read operation is to be performed, current flowing within memory cell CE11 based on the stored data generates a voltage difference between digit lines B1 and B2. The AND signal Y11 made by bank selection signal BS1 and digit decoded signal Y1 assumes a high level to activate digit switching transistors $M_{11a}$ and $M_{11b}$, thereby allowing the data on the digit lines B1 and B2 to be transferred through data lines D1 and DB1 to input/output data bus BUS1 after it is amplified by the read/write buffer RW1.

During the read operation for memory cell CE11, adjacent memory cell CE12 connected to digit line B2 does not affect the signal on digit line B2 because word line W12 is inactive due to a low level of bank selection signal BS2. The inactive bank selection signal BS2 also inactivates digit switching transistors M12$a$ and M12$b$ by making a low level of AND signal Y12, thereby disconnecting the digit line B2 from data line D2.

In a writing operation for memory cell CE11, the data supplied from input/output data bus BUS1 through read/ write buffer RW1 lowers the voltage of data line D1 or DB1 depending on the data to be stored, lowers the voltage of digit line B1 or B2 through digit switching transistors M11a and M11b, lowers one of the internal memory nodes of memory cell CE11 through transfer transistors M1 or M2, thereby storing data on digit line B1 and B2 into memory cell CE11.

Similarly, when memory cell CE12 is selected, the data stored in memory cell CE12 is transferred to data lines D2 and DB2 by activating word line W12 and coupling digit lines B2 and B3 to data lines D2 and DB2, respectively. Thus, digit line B2 is used to select the memory cells CE11 and CE12. In this manner, each digit line is used in common to adjacent two rows, which provides a configuration wherein the number of digit lines ($B_1$–$B_{m+1}$) is almost equal to the number of rows ($B_1$–$B_m$) of the memory cells.

In the present embodiment, the arrangement depicted in FIG. 3 substantially shows the rough plane layout of the constituent elements in the memory device. Specifically, the word driver section for activating word lines for selecting odd-numbered columns is located on the left side of the memory array in the drawing, whereas digit selection section for the odd-numbered columns is located on the top side of the memory array. On the other hand, the word driver section for activating word lines for selecting an even-numbered column is located on the right side of the memory array in the drawing, whereas the digit selection section for the even-numbered columns is located on the bottom side of the memory array. In this manner, the number of transistor elements and interconnects in the peripheral circuit is reduced to conform with a reduced pitch of the columns of the memory cell.

Figure 4:
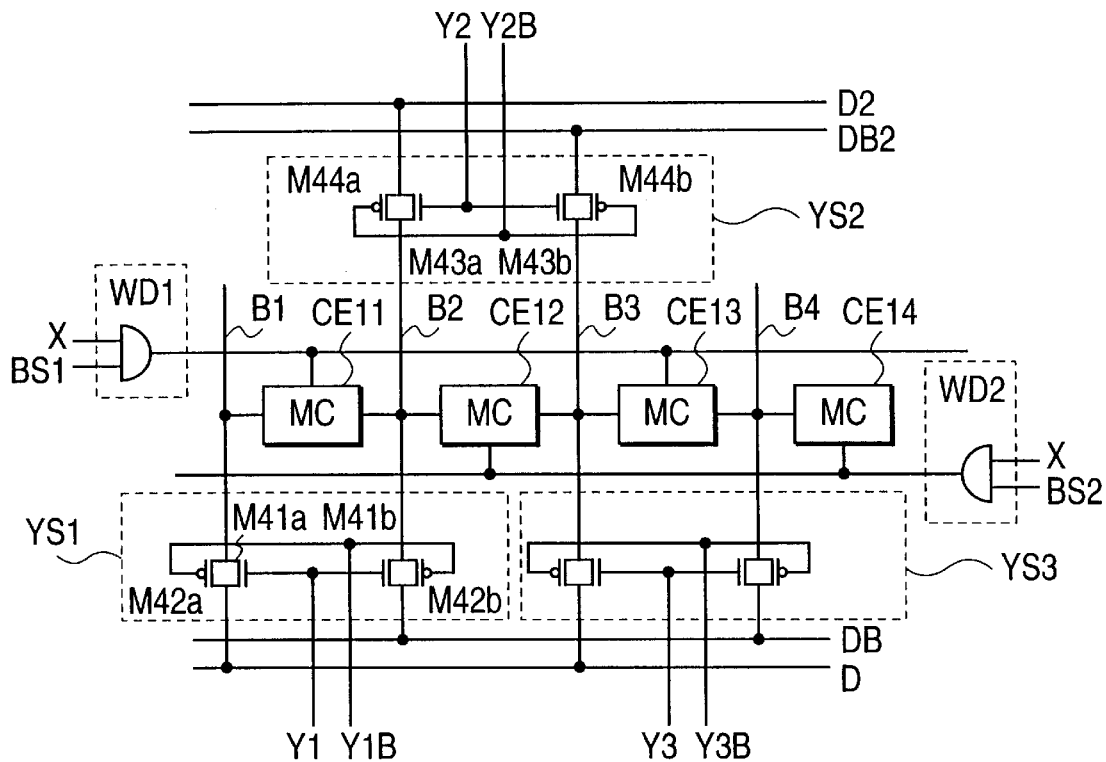
FIG. 4 is a schematic diagram of a part of FIG. 3 for showing the layout of some blocks of the peripheral circuit.

FIG. 4 shows a modification of a part of the memory device of FIG. 3, for comparing the arrangement of the memory device according to the present embodiment with that of the conventional memory device of FIG. 1 in an equivalent configuration. Digit line selecting block YS1 including nMOSFETs M41a and M41b and pMOSFETs M42a and M42b in FIG. 4 corresponds to nMOSFETs M11a and M11b in FIG. 3 for the first column of the memory cell. Digit line selecting block YS2 including nMOSFETs M43a and M43b and pMOSFETs M44a and M44b corresponds to nMOSFET M12a and M12b in FIG. 3 for the second column. Digit line selecting block YS3 in FIG. 4 corresponds to nMOSFFTs M21a and M21b in FIG. 3 for the third column. Digit line selection signals for activating digit selection block YS1, YS2 and YS3 includes signals Y1, Y2 and Y3 for activating nMOSFETs and signals Y1B, Y2B and Y3B for activating pMOSPETs.

As understood from comparison of both FIGS. 1 and 4, the peripheral circuit defining the column pitch of the memory array in FIG. 1 is divided into two sections located at the top and the bottom of the memory array in FIG. 4, whereas the peripheral circuit defiling the row pitch of the memory array in FIG. 1 in divided into two sections located at the left and the right sides of the memory array in FIG. 4. Data lines are also divided into two sections for transferring data from odd-numbered columns and even-numbered columns. By the configuration of FIG. 4, the transistor elements and signal interconnects in the peripheral circuit at each section is reduced by a half, which enables reduction of the column pitch and the row pitch of the memory cells.

The occupied area itself for the divided peripheral circuit sections and data lines in FIG. 4 increases to some extent compared to the peripheral circuit and data lines of the conventional memory device of FIG. 1. In general, however, the occupied area for the peripheral circuit is on the order of ⅕ of the occupied area for the memory array in a memory device, and the occupied area for the memory array increases with the recent increase of the storage capacity of the memory cell. Accordingly, the increase of the occupied area for the peripheral circuit is less significant and will become negligible compared to the advantages of the pitch reduction in the memory cell for a next generation memory device. Thus, the present embodiment achieves the advantage of the reduction of the chip area by reduction of the pitches of the memory cells over the conventional memory device.

Figure 5:
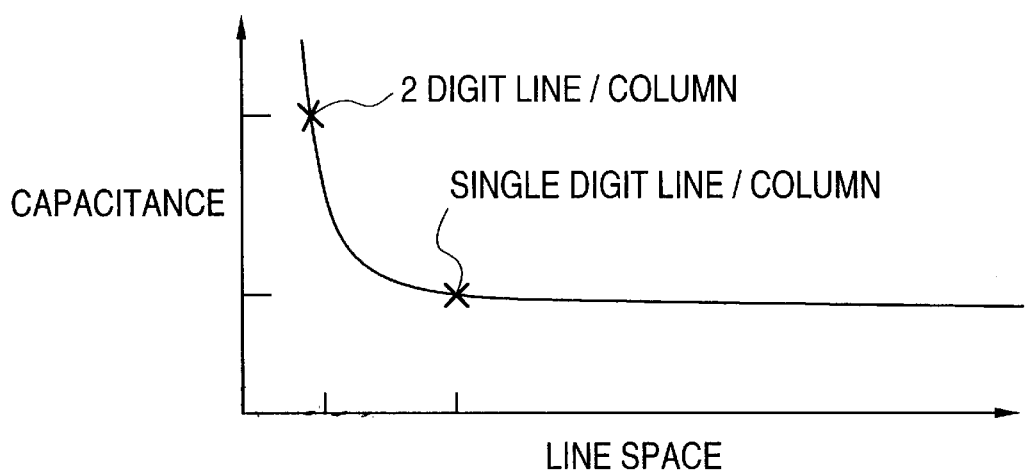
FIG. 5 is a graph of parasitic capacitance of digit lines plotted against the line space.

FIG. 5 graphically shows parasitic capacitance between interconnects plotted against the space between the interconnects. In the present embodiment, since a single digit line is provided between adjacent columns of the memory cells, the parasitic capacitance is reduced significantly compared to the case of a pair of digit lines disposed between adjacent columns of the memory cells, as shown in FIG. 5. Accordingly, the reduction of the column pitch does not significantly reduce the operational speed of the memory device of the present embodiment, which means that the present embodiment can provide an optimum condition for a smaller chip area and a higher operational speed.

Figure 6:
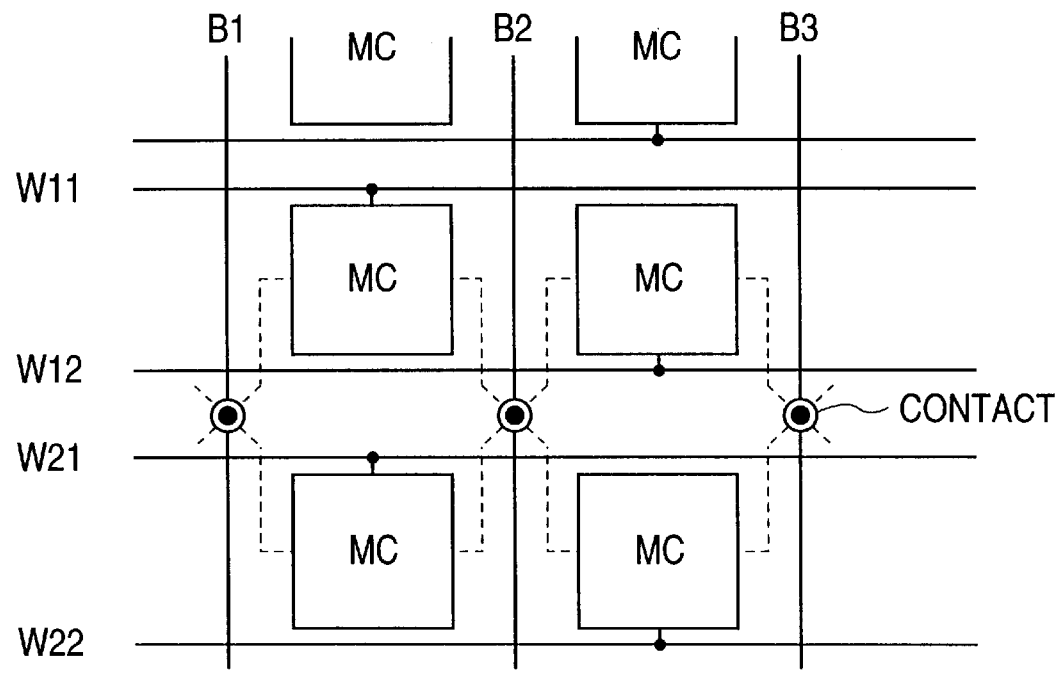
FIG. 6 is a top plan view of a layout of memory cells and contacts therefor.
Figure 7:
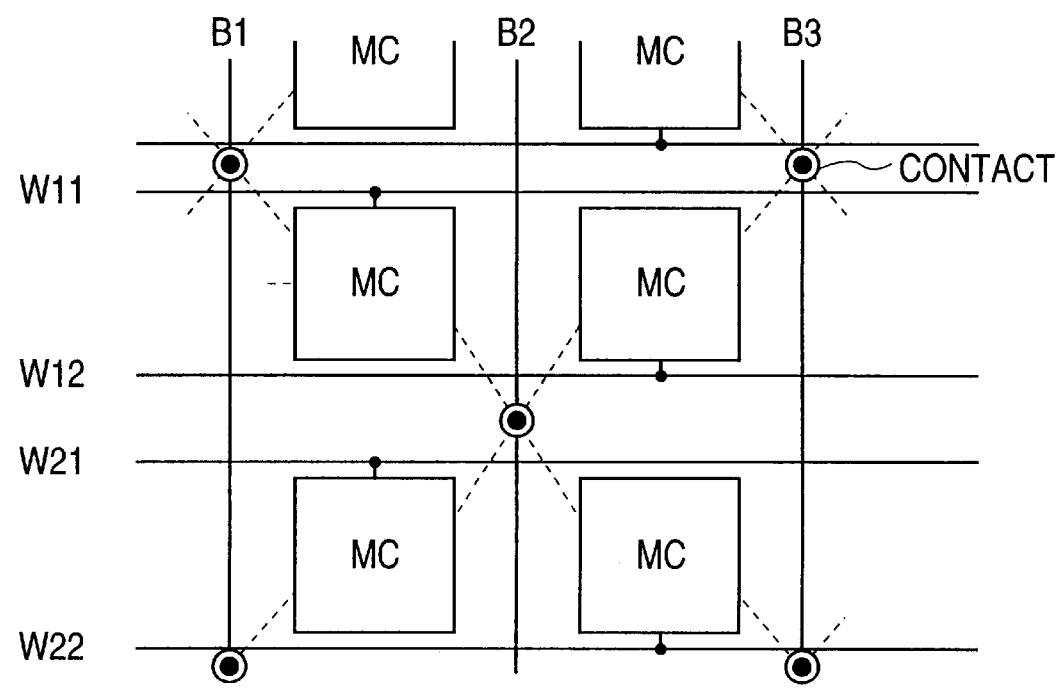
FIG. 7 is another top plan view of a layout of memory cells and contacts therefor.

In order to reduce the parasitic capacitance of the digit lines in a memory device, it is desired that the parasitic capacitance associated with contacts for the memory cell be reduced together with reduction of the line capacitance. In general, a relatively large area is desired for the source/drain regions of MOSFETs in a memory cell for assuring reliable contacts with aluminum digit lines, which generally increases the parasitic capacitance of the digit lines. The increase of the parasitic capacitance associated with the contacts can be suppressed by a common contact between a plurality of memory cells. FIGS. 6 and 7 show examples of a common contact between a plurality of memory cells. The contacts each disposed for four memory cells are aligned in a row direction and in a column direction in FIG. 6, whereas the contacts are arranged in a zigzag fashion in the row direction in FIG. 7. By employing these configurations, the number of contacts is not increased in the case of a single digit line disposed between adjacent columns, thereby decreasing the parasitic capacitance associated with the contacts, although the number of memory cells connected to a single contact increases.

The reduction of the number of transistor elements and signal interconnects per column of the memory cells in the peripheral circuit section improves the yield because of the increase of the margin in the photolithographic patterning technique. That is, the present embodiment reduces the limit in patterning imposed upon the configuration wherein a single digit line is disposed between adjacent columns.

Figure 8:
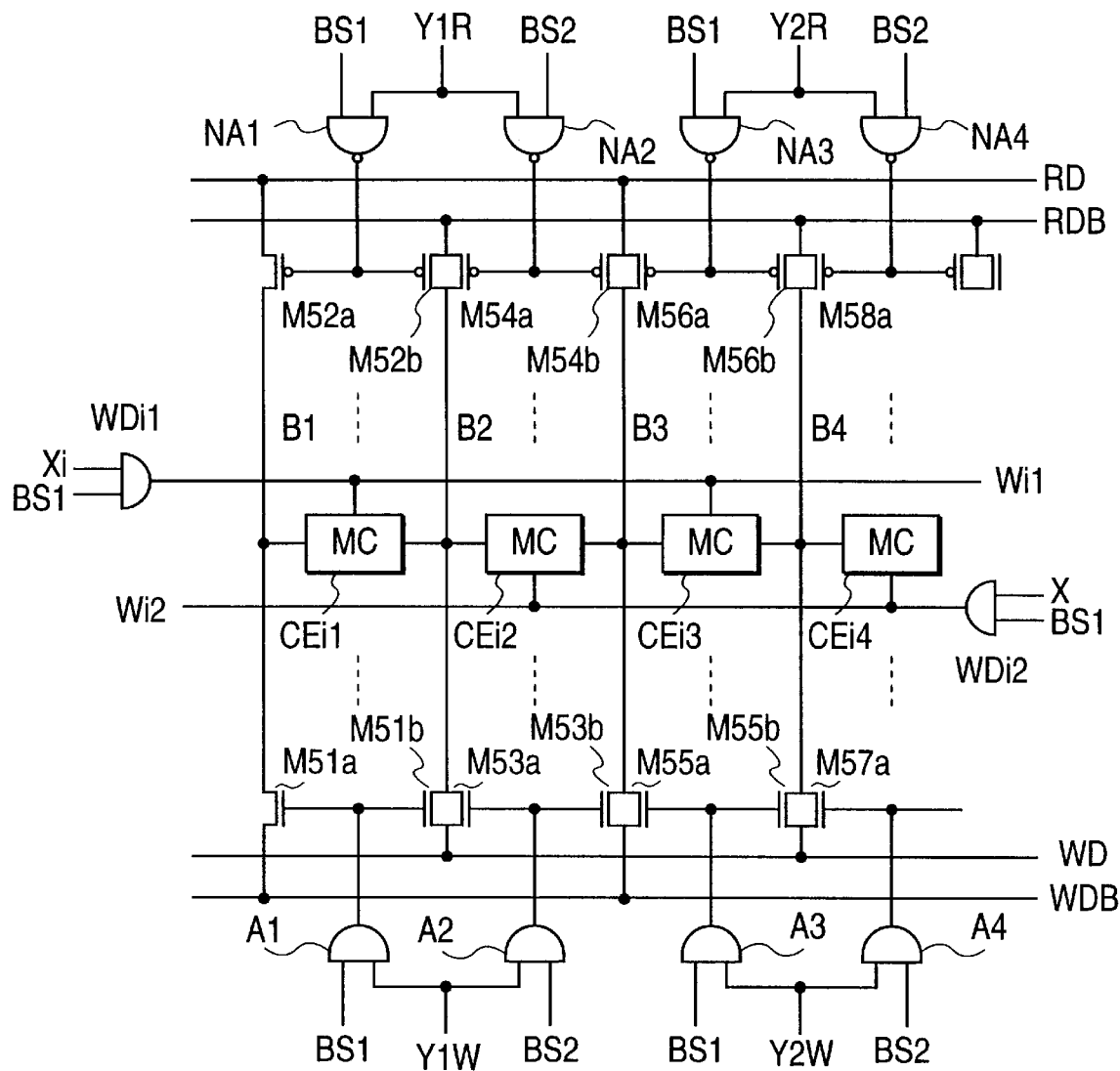
FIG. 8 is a schematic diagram of a memory device according to a second embodiment of the present invention.

Referring to FIG. 8, in a SRAM device according to a second embodiment of the present invention, another configuration is employed wherein a read section and a write section in the peripheral circuit are separated in place of separation based on the number of the order of the columns as used in the first embodiment.

Specifically, in the present embodiment, a pair of word lines $W_{i1}$ and $W_{i2}$ are provided for an i-th row of memory cells $CE_{i1}$–$CE_{im}$ and both the word lines Wi1 and Wi2 are connected to the gates of transfer transistors of the memory cells $CE_{ij}$ in odd-numbered rows and the gates of transfer transistors of the memory cells in even-numbered rows, respectively. The word line $W_{i1}$ disposed at the left side of the memory array for selecting the odd-numbered columns is activated by word driver $WD_{i1}$ generating an AND signal from word decoded signal Xi and bank selection signal BS1 for selecting odd-numbered columns. The word line $W_{i2}$ disposed at the right side for selecting even-numbered columns is activated by word driver $WD_{i2}$ generating an AND signal from word decoded signal Xi and bank selection signal BS2 for selecting even-numbered columns. The configuration as described above is similar to that of the first embodiment.

Digit lines $B_j$ and $B_{j+1}$ (j=2k-1, for example,) are disposed for odd-numbered j-th column, with digit line $B_j$ being commonly shared by (j-1)-th column and with digit line $B_{j+1}$ being commonly shared by (j+1)-th column. The top end of digit line $B_j$ is connected to read data line RD through parallel pMOSFETs (such as M54b and M56a) for reading, whereas the top end of digit line $B_{j+1}$ is connected to read data line RDB through parallel pMOSFETs (such as M56b and M58a). The pMOSFETs (such as M56a and M56b) for j-th column are activated by NAND gate NAk receiving bank selection signal BS1 for selecting odd-numbered columns and digit decoded signal YkR for reading.

The bottom end of digit line $B_j$ is connected to write data line WD through parallel pMOSFETs (such as M53b and M55a), whereas digit line $B_{j+1}$ is connected to write data line WDB through parallel pMOSFETs (such as M55b and M57a). The pMOSFETs for j-th column is activated by bank selection signal BS1 and column decoded signal YkW for writing.

In the present embodiment, a pair of digit switching transistors are disposed in each of digit drive sections for writing use and reading use in each column, and the column switching transistors for reading use and writing use are disposed at top and bottom ends of the digit lines. In this configuration, a space for receiving a pair of switching transistors and a signal line for bank selection signal BS1 or BS2 is sufficient for a single digit line, thereby achieving advantages similar to those in the first embodiment.

In operation of the present embodiment, data read out from memory cell CEi1 through digit lines B1 and B2 is transmitted to read data lines RD and RDB through pMOSFET M52a and M52b activated by digit decoded signal Y1R for read-out and bank selection signal BS1. The data thus read out is transferred outside the memory device after amplification. When data is to be stored in memory cell CEi1, digit selection signal Y1W for writing and bank selection signal BS1 are activated to turn on nMOSFETs M51a and M51b, thereby transferring data from write data lines Wd and WDB through digit lines B1 and B2 to memory cell CEi1.

In the present embodiment, pMOSFETs and nMOSFETs are completely separated at the top ends and the bottom ends of the digit lines, which achieves an advantage based on the fact that the margin requested for separating nMOSFETs or pMOSFETs is lower compared to the margin requested for separation between a pMOSFET and an nMOSFET.

Figure 9:
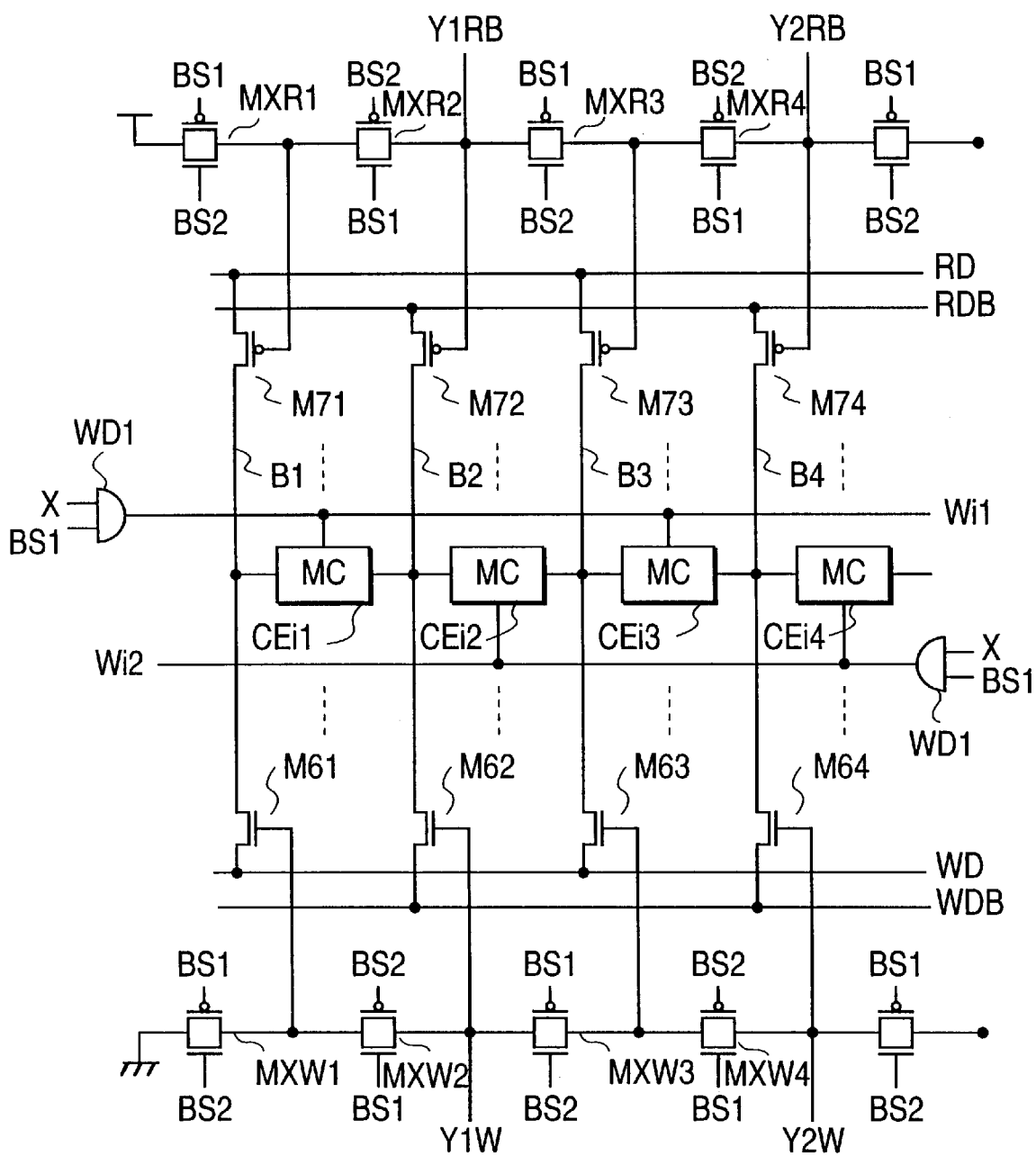
FIG. 9 is a schematic diagram of a memory device according to a third embodiment of the present invention.

Referring to FIG. 9, a memory device according to a third embodiment of the present invention comprises a single digit line selecting switch for a read circuit and a single digit line selecting switch for a write circuit, both switches being located at the top and bottom ends, respectively, of each digit line. The digit line selecting switch for the read circuit is implemented by a pMOSFET such as M71, M72 . . . , whereas the digit line selecting switch for the write circuit is implemented by an nMOSFET such as M61, M62, . . . .

Digit decoded signal $Y_{kRB}$ for read-out from even-numbered j-th column (j=2k) is a low-active signal, and is supplied to the gate of pMOSFET M7k connected between even-numbered digit line $B_j$ and read data line RDB. Odd-numbered (j-1)-th digit line $B_{j-1}$ is connected to read data line RD through a corresponding pMOSFET. The gate of pMOSFET $M_{7(j-1)}$ for selecting odd-numbered digit line $B_{k-1}$ is connected to the gate of pMOSFFT for selecting either adjacent even-numbered digit line Bk-2 or Bk through multiplexer $MX_{R(j-1)}$ or $MX_{Rj}$ depending on the active level of bank selection signal BS1 or BS2. On the other hand, column decoded signal $Y_{jWB}$ (j=2k) for writing is active at a high level thereof. Column decoded signal $Y_{kWB}$ is supplied to the gate of column selection nMOSFET $M_{6j}$ connected between even-numbered digit line Bj and write data line RWB. Odd-numbered digit line is connected to write data line RW through a corresponding nMOSFET. The gate of nMOSFET $M_{6(j-1)}$ for selecting odd-numbered digit line $B_{j-1}$ is connected to the gate of nMOSFET for selecting either adjacent even-numbered digit line $B_{j-2}$ or $B_j$ through multiplexer $MX_{Wj-1}$ or $MX_{Wj}$ depending on the active level of bank selection signal BS1 or BS2.

In a read operation, even-numbered digit line $B_j$ is selected by digit decoded signal YjRB, whereas odd-numbered digit line $B_{j-1}$ is selected by either YjRB and BS1 or $Y_{(j-1)RB}$ and BS2. In a write operation, even numbered digit line Bj is selected by digit decoded signal YjW, whereas odd-numbered digit line Bj-1 is selected by either YjW and BS1 or $Y_{(j-1)W}$ and BS2.

Figure 10:
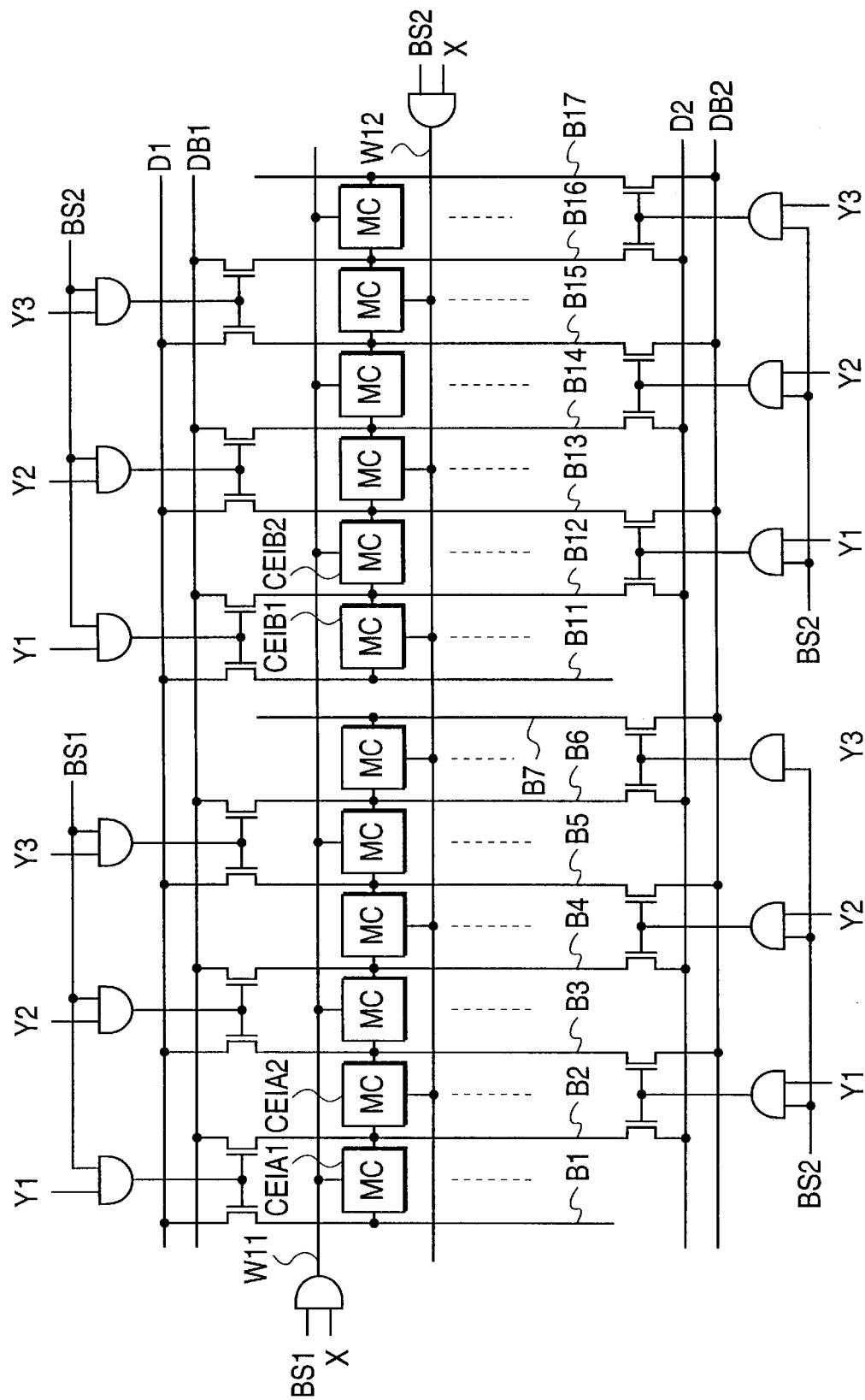
FIG. 10 is a schematic diagram of a memory device according to a fourth embodiment of the present invention.

Referring to FIG. 10, a memory device according to a fourth embodiment of the present invention is of a multi-bit input/output type, wherein input/output data pins are generally arranged at opposite sides of the chip for use in an independent read/write operation. When BS1 is active in a read operation, data from odd-numbered columns in the left block (CE1A1, CE1A2, . . . ) of the memory cells is read out from the top data lines D1 and DB1 by digit decoded signals Y1, Y2 and Y3. When BS2 is active, data from even-numbered columns in the left block of the memory cells is read out from the bottom data lines D2 and DB2 by digit decoded signals Y1, Y2 and Y3. In the right block (CE1B1, CE1B2, . . . ) of the memory cells, the bank selection signals BS1 and BS2 are reversed from the case of the left block of the memory cells. Specifically, data from the odd-numbered columns of the memory cells is read out by the active level of BS2 through the top data lines D1 and DB1, whereas data from the even-numbered column of the memory cells is read out by the active level of BS1 through the bottom data lines D2 and DB2. In the present embodiment, two digit lines are disposed between the last column of the left block and the first column of the right block, because these columns are activated by the same word line W12.

Figure 11:
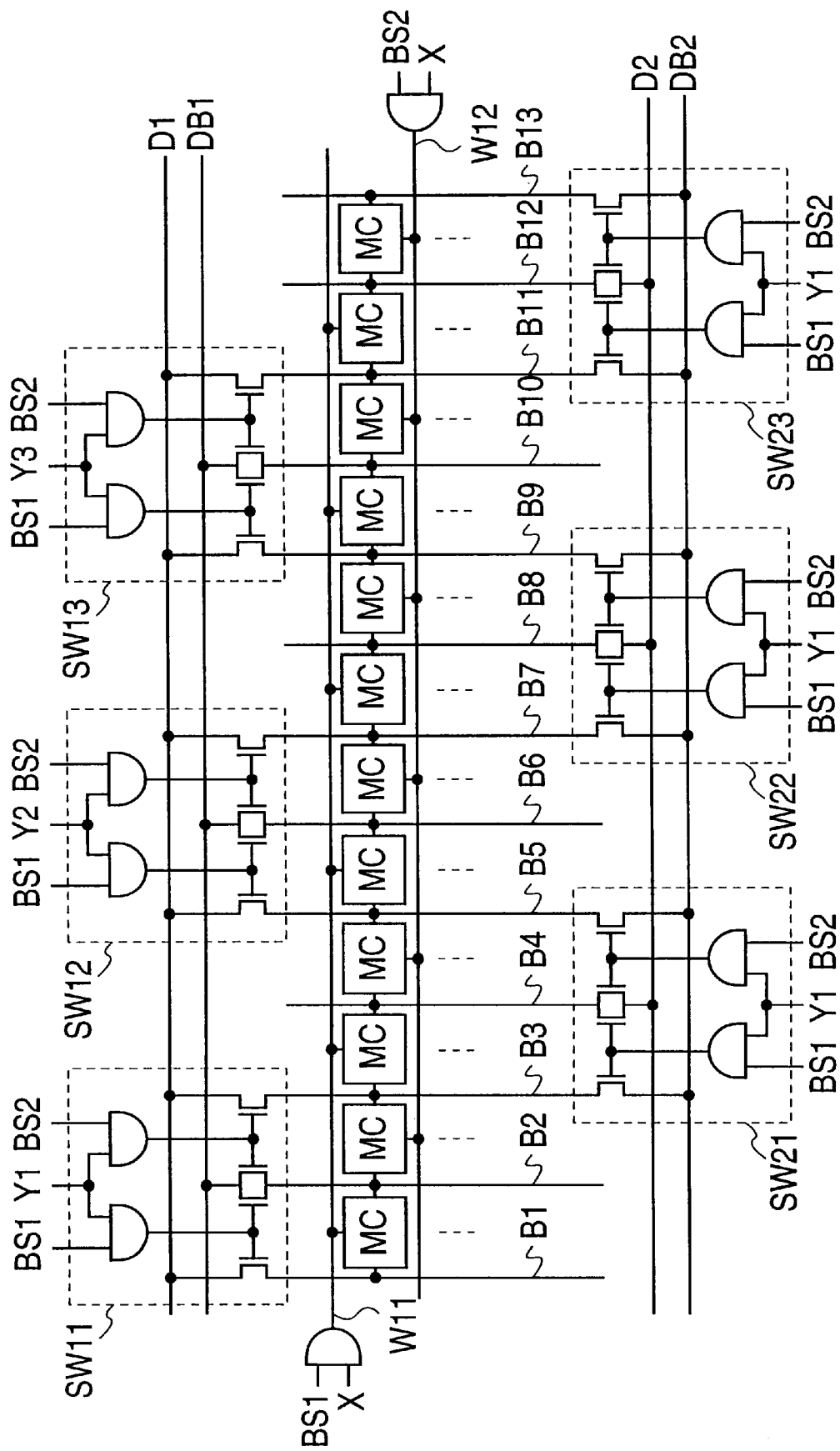
FIG. 11 is a schematic diagram of a memory device according to a fifth embodiment of the present invention.

Referring to FIG. 11, a memory device according to a fifth embodiment of the present invention is obtained by modification of the fourth embodiment wherein two digit lines are disposed between the two blocks. Specifically, in the present embodiment, a top switch circuit SW1n and a bottom switch circuit SW2n are alternately disposed for every other blocks each including adjacent two of the columns. Four consecutive columns are specified by the same digit decoded signal Y1, Y2, Y3, . . . and bank selection signal BS1 or BS2. That is, adjacent odd-numbered columns, for examples first column and third column are supplied with the same digit decoded signal to thereby operate concurrently. It does not generate any error because both the columns do not share a single digit line, and also data lines are completely separated.

In the above embodiments, both the word line driver and the digit line driver are separated at the top and bottom and left and right, respectively, of the memory array. However, a configuration may be employed wherein either one of word line driver and digit line driver is separated.

What is claimed is:

1. A memory device comprising a memory array including a plurality of memory cells arranged in a matrix along a column direction and a row direction, a pair of digit lines extending along said column direction for each column of said memory cells so that each of said digit lines disposed between adjacent two columns is shared by the two columns, a pair of word lines extending in said row direction for each row of said memory cells, one of said pair of word lines being connected to memory cells in odd-numbered columns and the other of said pair of word lines being connected to memory cells in even-numbered columns, a word driver controlled by a bank selection signal for selectively activating either one of said pair of word lines, first and second pairs of data lines disposed in vicinities of one and the other sides, respectively, of said memory array, a first digit driver section for selectively connecting said pairs of digit lines to said pair of first data lines, a second digit driver section for selectively connecting said pairs of digit lines to said pair of second data lines, said bank selection signal activating either one of said first and second digit driver sections.

2. A memory device as defined in claim 1, wherein said first and second digit driver sections are disposed at respective ends of said digit lines.

3. A memory device as defined in claim 1, wherein said first driver section connects said pair of digit lines disposed for memory cells in odd-numbered columns to said first data lines, and said second driver section connects said pair of digit lines disposed for memory cells in even-numbered columns to said second data lines.

4. A memory device as defined in claim 1, wherein said first digit driver section and said first data lines are used for reading data from said memory cells, and second digit driver section and said second data lines are used for storing data in said memory cells.

5. A memory device as defined in claim 4, wherein switching transistors in said fist digit driver section are implemented by pMOSFETs and switching transistors in said second digit driver section are implemented by nMOSFETs.

6. A memory device as defined in claim 1, wherein said pair of first data lines and said pair of second data lines are operated independently of each other.

7. A memory device as defined in claim 6, wherein said column of said memory cells are grouped in first and second groups based on a location of said memory cells.

8. A memory device as defined in claim 7, wherein said first group and second groups are divided by a substantially central line of said memory array.

9. A memory device as defined in claim 7, wherein said first group and second group appear alternately after every four columns of said memory cells.

10. A memory device as defined in claim 1, wherein said word driver is separated into first and second word driver sections disposed at respective edges of said memory array as viewed in said row direction.

11. A memory device as defined in claim 10, wherein said first and second word driver sections activate memory cells in said odd-numbered columns and memory cells in said even-numbered columns, respectively.

12. A memory device comprising a memory array including a plurality of memory cells arranged in a matrix along a column direction and a row direction, a pair of digit lines extending along said column direction for each column of said memory cells so that each of said digit lines disposed between adjacent two columns is shared by the two columns, a pair of word lines extending in said row direction for each row of said memory cells, one of said pair of word lines being connected to memory cells in odd-numbered columns and the other of said pair of word lines being connected to memory cells in even-numbered columns, a word driver including first and second driver sections each controlled by a bank selection signal for selectively activating a corresponding one of said pair of word lines, a pair of data lines for transferring a pair of signals, a digit driver section for selectively connecting said pairs of digit lines to said pair of data lines.

* * * * *